United States Patent
Cercone et al.

[11] Patent Number: 6,103,018
[45] Date of Patent: Aug. 15, 2000

[54] METHOD FOR EXTRACTING RESIDUE FROM A SPONGE MATERIAL AND METHOD OF CLEANING MATERIAL WITH THE SPONGE

[75] Inventors: Ronald J. Cercone, East Lyme; Gerald D. Ingram; Leon C. Nunier, both of Mystic, all of Conn.; Scott J. Quaratella, Westerly, R.I.

[73] Assignee: Xomed Surgical Products, Inc., Jacksonville, Fla.

[21] Appl. No.: 09/095,556

[22] Filed: Jun. 11, 1998

Related U.S. Application Data

[60] Division of application No. 08/850,772, May 2, 1997, which is a continuation-in-part of application No. 08/780,895, Jan. 9, 1997, which is a continuation-in-part of application No. 08/319,005, Oct. 6, 1994, abandoned.

[51] Int. Cl.[7] ....................................................... B08B 3/04
[52] U.S. Cl. .............................. 134/28; 134/2; 134/22.1; 134/22.11; 134/22.13; 134/22.17; 134/26; 134/94.1; 134/95.1; 134/100.1; 134/103.2
[58] Field of Search ........................... 134/22.1, 2, 22.11, 134/22.13, 22.17, 26, 28, 94.1, 95.1, 100.1, 103.2

[56] References Cited

U.S. PATENT DOCUMENTS

| | | |
|---|---|---|
| 1,002,842 | 9/1911 | Harriss . |
| 1,002,913 | 9/1911 | Harriss . |
| 1,094,361 | 4/1914 | Blevney . |
| 1,775,186 | 9/1930 | Bartling . |
| 2,053,604 | 9/1936 | Dullinger . |
| 2,485,428 | 10/1949 | Bleier et al. . |
| 2,525,965 | 10/1950 | Smith .......................................... 18/55 |
| 2,609,347 | 9/1952 | Wilson ..................................... 260/2.5 |
| 2,932,859 | 4/1960 | Rockoff .................................... 19/443 |
| 3,190,843 | 6/1965 | Hofelmann et al. ..................... 260/2.5 |
| 3,318,856 | 5/1967 | Deyrup ................................... 260/91.3 |
| 3,481,888 | 12/1969 | Sinclair ..................................... 260/2.5 |
| 3,591,543 | 7/1971 | Stafford ................................... 260/29.6 |
| 3,663,470 | 5/1972 | Nishimura et al. .................... 260/2.5 F |
| 3,673,125 | 6/1972 | Takahashi et al. ..................... 260/2.5 F |
| 3,737,398 | 6/1973 | Yamaguchi ........................... 260/2.5 F |
| 3,858,329 | 1/1975 | Koide et al. .................................. 34/1 |
| 3,915,671 | 10/1975 | Kagawa ..................................... 51/296 |
| 3,988,245 | 10/1976 | Wang ................................. 210/500 M |
| 4,083,906 | 4/1978 | Schindler et al. ......................... 264/49 |
| 4,098,728 | 7/1978 | Rosenblatt .............................. 521/141 |
| 4,111,666 | 9/1978 | Kalbow .................................... 51/295 |

(List continued on next page.)

FOREIGN PATENT DOCUMENTS

| | | |
|---|---|---|
| 62-42886 | 9/1987 | Japan . |
| 2-234774 | 9/1990 | Japan . |
| 2-234775 | 9/1990 | Japan . |
| 3-29100 | 4/1991 | Japan . |
| 4-72304 | 3/1992 | Japan . |
| WO 91/10688 | 7/1991 | WIPO . |
| WO 94/25189 | 10/1994 | WIPO . |
| WO 95/24174 | 9/1995 | WIPO . |

*Primary Examiner*—Lyle A. Alexander
*Assistant Examiner*—S. Carrillo

[57] ABSTRACT

An industrial sponge device and a method of manufacturing the same. The sponge is made from a polyvinyl acetal material with a process in which the pores are formed by gas to provide an open pore structure having no fibrils. Additionally, the sponge is purified by an extracting process which includes alternating exposure of the partially cross-linked sponge to acid and oxidizing solutions. The sponge is sterilized by electron beam radiation to destroy micro organisms that can cause contamination of the final product. The resulting sponge material is formed into an industrial sponge having a cylindrical body and a plurality of projections extending from the body. The projections are tapered truncated cones having a cross-sectional radius that decreases with distance from the body. The extracting process permits residual amounts of calcium, zinc, and other elements to be 2 ppm or less; preferably 1 ppm or less.

15 Claims, 5 Drawing Sheets

U.S. PATENT DOCUMENTS

| | | | |
|---|---|---|---|
| 4,197,371 | 4/1980 | Holst et al. | 521/84 |
| 4,279,752 | 7/1981 | Sueoka et al. | 210/500.2 |
| 4,430,447 | 2/1984 | Pospich et al. | 521/53 |
| 4,552,138 | 11/1985 | Hofeditz et al. | 128/156 |
| 4,566,911 | 1/1986 | Tomita et al. | 134/6 |
| 4,692,473 | 9/1987 | Wright et al. | 521/72 |
| 4,750,915 | 6/1988 | Tomita et al. | 51/298 |
| 4,767,793 | 8/1988 | Schisler et al. | 521/50.5 |
| 4,807,339 | 2/1989 | Hayashi | 29/121.5 |
| 4,841,680 | 6/1989 | Hoffstein et al. | 51/283 R |
| 4,902,511 | 2/1990 | Kronman | 424/423 |
| 4,925,453 | 5/1990 | Kannankeril | 604/378 |
| 4,969,226 | 11/1990 | Seville | 15/244.4 |
| 5,009,652 | 4/1991 | Morgan et al. | 604/385.1 |
| 5,059,659 | 10/1991 | Gregor et al. | 525/329.1 |
| 5,071,648 | 12/1991 | Rosenblatt | 424/78.06 |
| 5,144,711 | 9/1992 | Gill, Jr. | 15/97.1 |
| 5,155,138 | 10/1992 | Lundqvist | 521/76 |
| 5,164,088 | 11/1992 | Hanel et al. | 210/500.39 |
| 5,169,904 | 12/1992 | Ziemelis et al. | 525/330.2 |
| 5,217,663 | 6/1993 | Seville | 264/51 |
| 5,284,468 | 2/1994 | Nelson | 602/5 |
| 5,288,763 | 2/1994 | Li et al. | 521/61 |
| 5,311,634 | 5/1994 | Andros | 15/97.1 |
| 5,326,629 | 7/1994 | Vaughn et al. | 428/224 |
| 5,370,656 | 12/1994 | Shevel | 606/196 |
| 5,387,206 | 2/1995 | Valentine et al. | 604/358 |
| 5,414,914 | 5/1995 | Suzuki et al. | 28/105 |
| 5,447,505 | 9/1995 | Valentine et al. | 604/304 |
| 5,453,078 | 9/1995 | Valentine et al. | 600/37 |
| 5,460,655 | 10/1995 | Pisacane et al. | 134/6 |
| 5,466,231 | 11/1995 | Cercone et al. | 604/369 |
| 5,469,864 | 11/1995 | Rosenblatt | 128/849 |
| 5,502,082 | 3/1996 | Unger et al. | 521/141 |
| 5,504,124 | 4/1996 | Cassidy et al. | 521/53 |
| 5,524,642 | 6/1996 | Rosenblatt | 128/849 |
| 5,526,546 | 6/1996 | Kamen | 15/207.2 |
| 5,554,658 | 9/1996 | Rosenblatt | 521/51 |
| 5,554,659 | 9/1996 | Rosenblatt | 521/51 |
| 5,556,391 | 9/1996 | Cercone et al. | 604/369 |
| 5,597,850 | 1/1997 | Rainer | 521/29 |
| 5,639,311 | 6/1997 | Holley et al. | 134/6 |
| 5,744,150 | 4/1998 | Cercone | 424/404 |
| 5,745,945 | 5/1998 | Manfredi et al. | 15/77 |
| 5,776,225 | 7/1998 | Megy | 75/304 |

METHOD FOR EXTRACTING RESIDUE FROM A SPONGE MATERIAL AND METHOD OF CLEANING MATERIAL WITH THE SPONGE

CROSS-REFERENCE TO RELATED PATENT APPLICATIONS

This application is a division of U.S. patent application Ser. No. 08/850,772, filed May 2, 1997, which is a continuation-in-part of U.S. patent application Ser. No. 08/780,895 filed on Jan. 9, 1997 which is a continuation-in-part of U.S. application Ser. No. 08/319,005 filed on Oct. 6, 1994, now abandoned, the disclosures of which are incorporated herein by reference.

BACKGROUND OF THE INVENTION

1. Field of the Invention

The present invention relates to an industrial sponge used for cleaning surfaces. More specifically, the invention is a synthetic industrial sponge made of polyvinyl acetal, and a method for extracting residue from the sponge to yield a sponge that leaves less particulate matter and has a longer life than conventional sponges, and a method of cleaning semiconductor material using the sponges.

2. Description of the Related Art

The use of synthetic sponges, made of polyvinyl acetal for example, is well known. For example, U.S. Pat. No. 4,566,911 discloses a scrubbing device using a polyvinyl acetal elastic material. Conventional sponges have been shaped in various forms, such as rollers and pads. These sponges are used to clean critical materials such as thin film disks, semiconductor wafers, data storage media, and other materials requiring removal of particles in the 0.1 micron range, i.e. "ultimate cleaning". Conventional synthetic sponges have a polymer structure with "dead end pockets" formed therein that trap residue and trace amounts of metals. As the sponge wears, these metals can come out of the sponge in the form of particulate matter. Such particulate matter can damage the surfaces that are to be cleaned. Further, this type of sponge has tiny fibrils in the pores thereof that are a result of spaces between the pore forming chemical additive during a cross-linking reaction. "Cross-linking" is the formation of ester bonding between chains of the two adjacent hydroxyl groups that occur with the reaction of polyvinyl alcohol and aldehyde. This reaction hardens and strengthens the resulting material.

U.S. Pat. No. 4,098,728, the disclosure of which is incorporated herein by reference, discloses a polyvinyl acetal sponge and a method for making the same. In this method, pore spaces in the sponge are formed by gas bubbles; not pore forming chemical additives such as starch/sulfate combinations. Because the sponge disclosed in this patent does not have any starch residue, or the like, it has been particularly useful in medical applications in which starch residues can cause a foreign body reaction when in contact with mucosal tissue.

Also, conventional sponges have been used to form cleaning rollers or the like having projections formed on a surface thereof. However, the conventional projections have walls that extend perpendicular to an outer surface of the sponge body. Such a configuration creates stress concentration areas. Accordingly, the projections break off of the roller surface after continued use. Therefore, conventional sponges having projections have a short useful life.

Finally, extraction processes, also known as purification processes, are used to remove particulate matter and residue from the sponge before the sponge is used for cleaning. However, conventional extraction processes have not adequately removed residue to the extent necessary for reliably cleaning semiconductor wafers or similar materials.

SUMMARY OF THE INVENTION

It is an object of the invention to overcome the limitations of the prior art polyvinyl acetal sponges.

It is a further object of the invention to minimize particulate residue in a polyvinyl acetal sponge.

It is still a further object of the invention to extend the life of polyvinyl acetal sponges.

The invention achieves these objectives by forming a polyvinyl acetal sponge with a process in which the pores are formed by gas to provide an open pore structure having no fibrils. Additionally, the sponge is purified by alternating exposure of the partially cross-linked sponge to solutions of high pH and low pH. The sponge is sterilized by electron beam radiation to destroy micro organisms that can cause contamination of the final product. Residue in the sponge is reduced to 2 ppm or less, preferably 1 ppm or less for many elements, zinc and calcium in particular.

The resulting sponge material is formed into an industrial sponge having a cylindrical body and a plurality of projections extending from the body. The projections are tapered truncated cones having a cross-sectional radius that decreases with distance from the body. The projections of the invention provide increased contact pressure without reducing the life of the industrial sponge to unacceptable levels. The sponge material can be used for cleaning semiconductor wafers or other materials by rolling the sponge across a surface of the material in a known manner.

DETAILED DESCRIPTION OF THE PREFERRED EMBODIMENT

Figure 1:
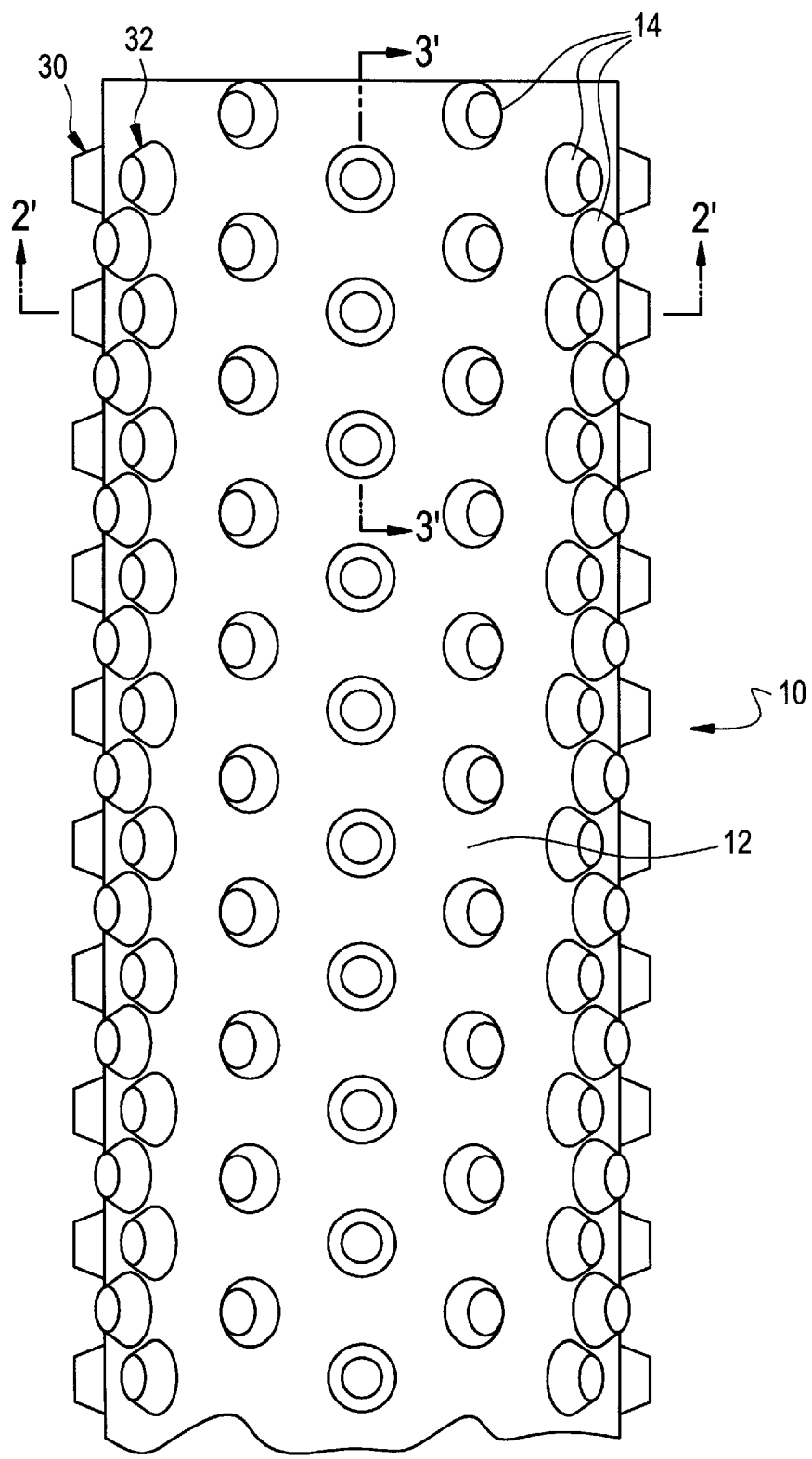
FIG. 1 is a perspective view of a sponge roller device according to a preferred embodiment of the invention.
Figure 2:
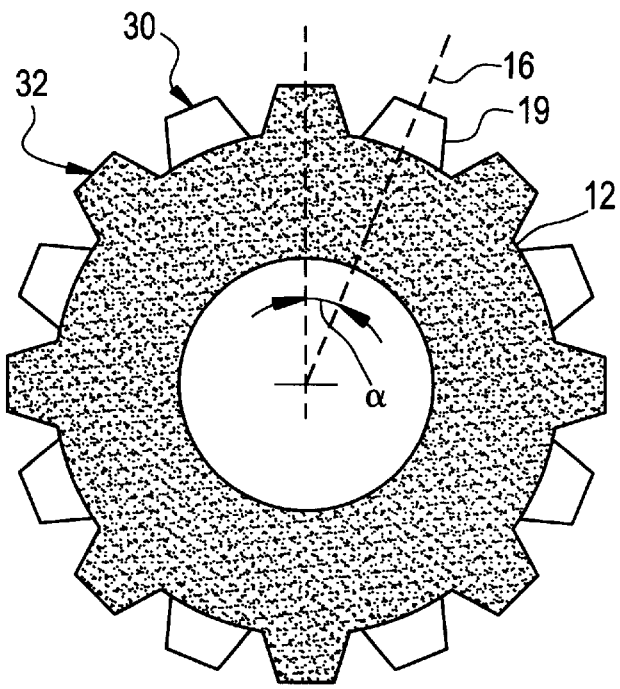
FIG. 2 is a cross-sectional view along line 2'—2' of FIG. 1.
Figure 3:
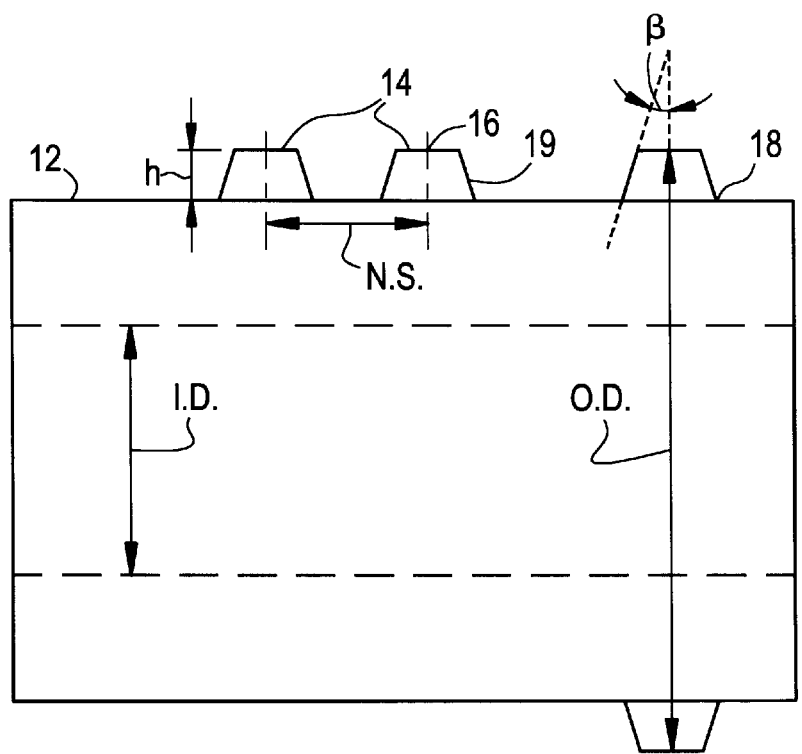
FIG. 3 is a partial cross-sectional view taken along line 3'—3' of FIG. 1.
Figure 4:
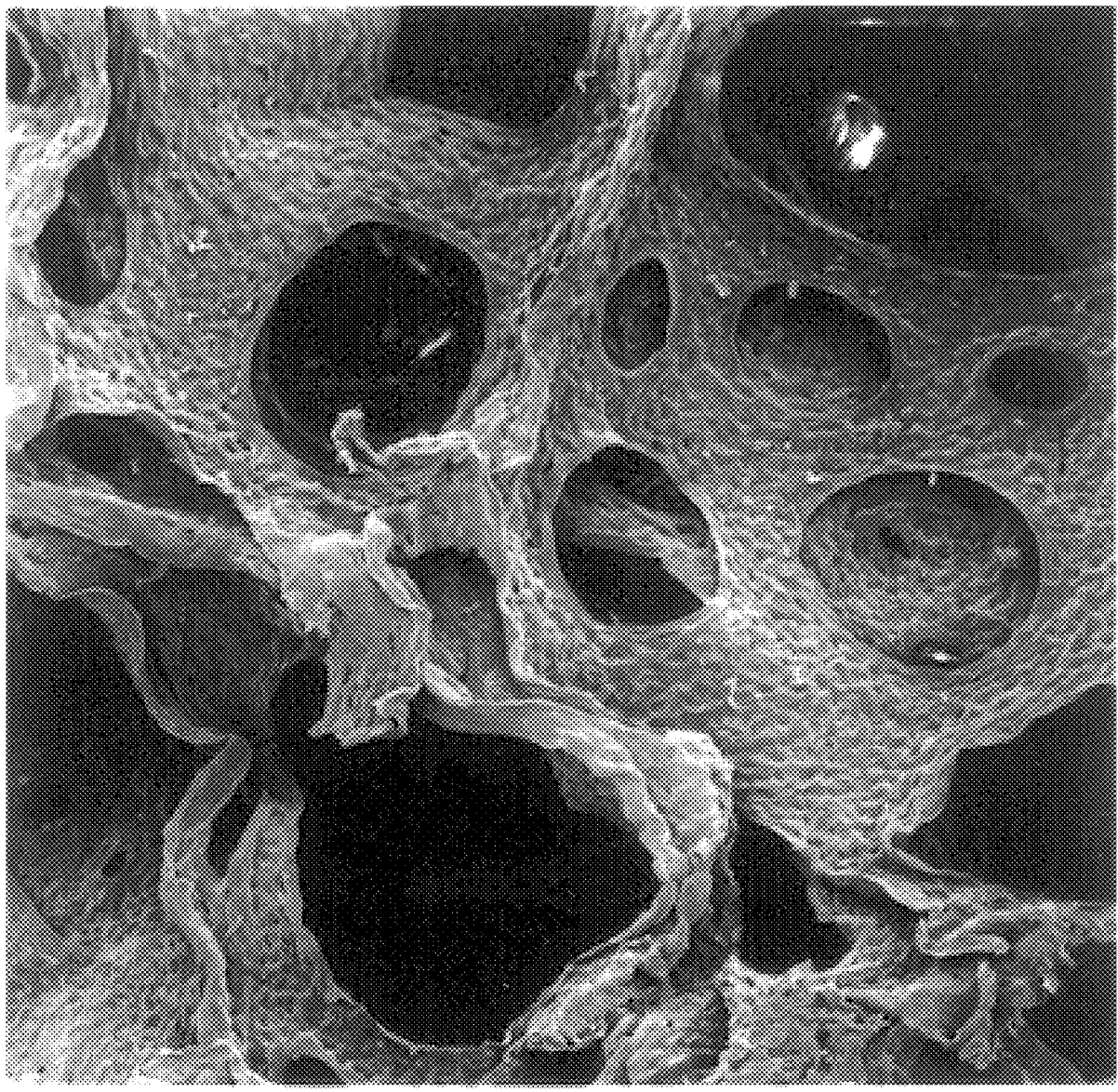
FIG. 4 is a micro photograph of the sponge material of the preferred embodiment.
Figure 5:
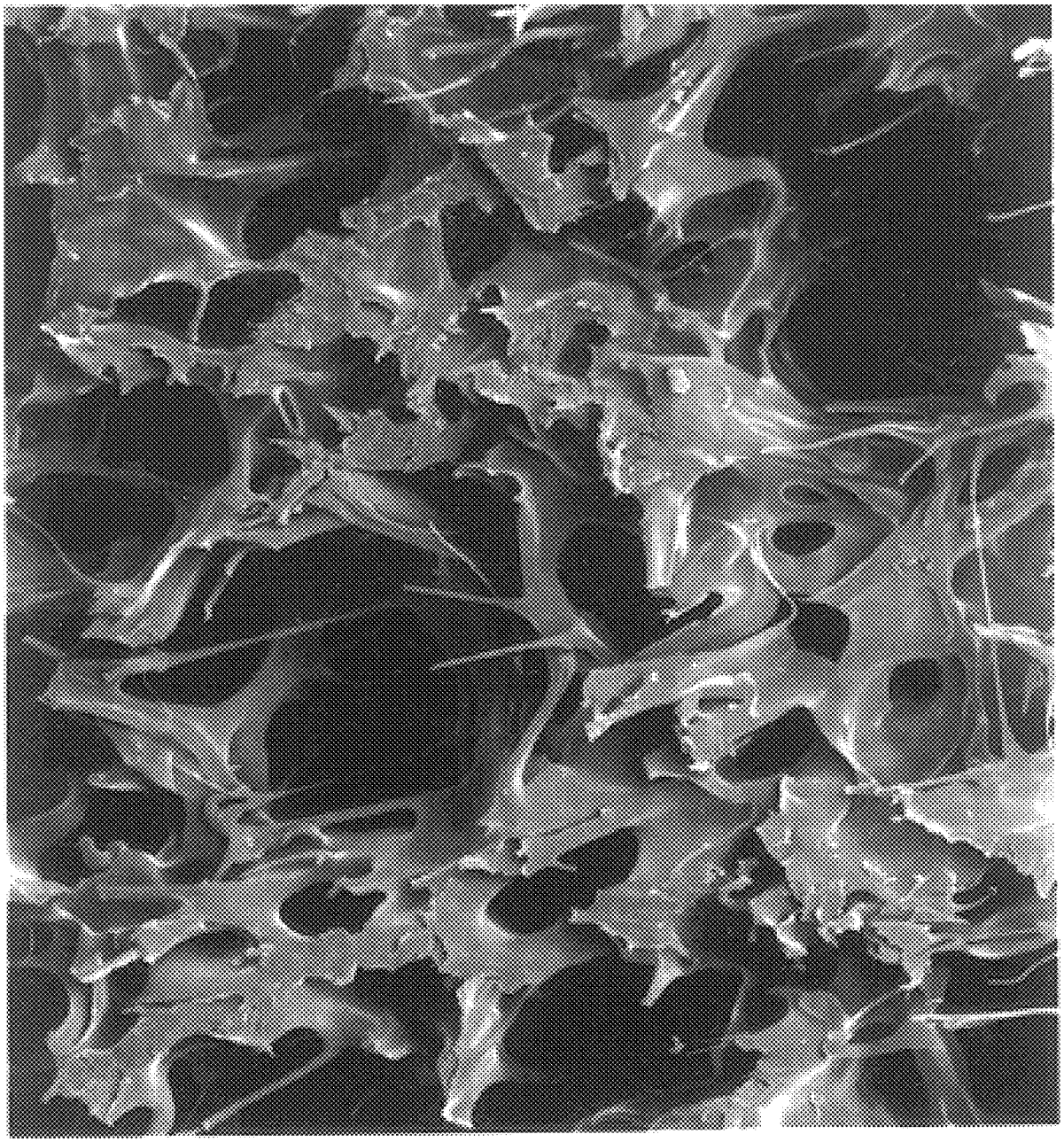
FIG. 5 is a microphotograph of a typical prior art sponge material.

A preferred embodiment of the invention is illustrated in FIGS. 1–3. Applicant has discovered that the sponge making process disclosed in U.S. Pat. No. 4,098,728, the disclosure of which is incorporated herein by reference, can yield a sponge material having 100% open pores with no "dead end pockets" and no fibrils. Specifically, the sponge material is a continuous porous web interconnected material lacking fibrils that can result from spaces between pore forming chemicals during conventional cross-linking reactions. In conventional sponge materials, fibrils are formed as uncross-linked polymer flows into the spaces existing between and around the agglomerated solid particles of starch/sulfate or other pore forming chemicals. As the cross-linking reaction proceeds, small incursions into these spaces become solidified as fibrils. FIG. 4 is a microphotograph of the sponge material used to form sponge roller device 10. The sponge material is formed of interconnected thin-walled structures with holes of substantially circular or oval cross section. The pore geometry of the sponge material does not contain micro fibers, i.e. fibrils, on the walls that define the pores. Also, the pore walls are attached to each other by a web-like membrane which is itself porous. In contrast, FIG. 5 illustrates the material used in cleaning and polishing rolls manufactured by Kanebo Corporation and distributed in the U.S. by Rippey, which is a typical conventional polyvinyl acetal sponge material. This material clearly contains tiny fibrils that were created by pore forming chemicals during a cross-linking reaction. These fibrils can come loose and fall as particulate matter onto the device being cleaned thus reducing the cleaning efficiency of the resuting sponge.

The specific geometry of the pores is a function of the reaction parameters, such as temperature, mixing technique, pore forming method, cure time, reactant concentration, catalyst type and concentration, flow rates, and the like, as described in the above-noted patent. An example of the sponge material that can be used for the invention is the same as that used to form the readily available Merocel Sponge™ and Merocel PVA Roller Brushes™ sold by Merocel Corporation which is made by the process disclosed in the above-noted patent. Additionally, applicant's have found that known continuous mixing techniques can be used in place of the mixing technique disclosed in the patent.

As illustrated in FIG. 1, sponge roller device 10 is molded to form a cylindrical body having outer surface 12 and a plurality of truncated conical projections 14 extending from outer surface 12. Projections 14 are disposed at regular intervals in rows 30 and 32 that are offset from one another, in a direction along the longitudinal axis of the cylindrical body, to result in a staggered arrangement of projections 14 as is best illustrated in FIGS. 1 and 2. Preferably, projections 14 extend from outer surface 12 to a height of approximately 0.1875 inches as illustrated in FIG. 3. Also, projections 14 preferably are disposed at intervals to define an angle α of 22.5° between radial lines extending through the central axes of adjacent offset projections as shown in FIG. 2. Preferably, the diameter of base 18 is at least 20% larger than the diameter of top surface 16. The area of base 18 is preferably 40% larger than that of top surface 16.

Each projection 14 has planar top surface 16 that has a diameter of 0.25 inches and thus an area of 0.049 square inches. Also, each projection 14 has base 18 having a diameter of 0.31 inches and thus an area of 0.073 square inches. The taper of projection walls 19, which define the outer surface of the truncated cone, defines an angle β that is in the range of 5–20°, inclusive, and is preferably about 10° with respect to the central axis of the projection as shown in FIG. 3. This tapered wall configuration provides a base for the projection that is sufficiently large and prevents stress concentration points to prevent reduced life of sponge roller device 10 due to broken projections 14. Also, the tapered wall configuration permits foreign matter on the object to be cleaned to enter readily between projections 14 and retained between projections 14.

The sponge material is shaped into the sponge roller device 10 by a molding process. In particular, a polyethylene, ABS, or the like material is formed, through molding or the like, into a mold, i.e. a female version of the outer shape of the sponge roller device, with allowances for shrinkage, the amount of which can be determined experimentally. The mold can be made in separate segments and joined into one unit. The segments can be interlocked with one another and held together by end caps, or the like. The froth reactant of the sponge material is injected, or otherwise introduced, into the assembled mold and then the filled mold is placed in an insulated container where temperature is controlled during curing. This process is described in detail in U.S. Pat. No. 4,098,728.

The molded sponge material is then subjected to an extraction process to remove any trace amounts of metal and other residues that can cause particulate matter to fall out of the sponge material. The partially cross-linked, i.e 60% or less cross-linked, molded sponge roller is alternately exposed to solutions of high and low pH to precipitate metals from the pore spaces (high pH solutions) and dissolve trace amounts of metals (low pH solutions) from the pore spaces. Crosslinking in the range of 25–55% yields a strong, yet flexible sponge material. A first preferred extraction method includes the following steps:

1(a) soaking the rollers in water to dilute reactants and halt cross-linking, then washing rinsing and extracting the rollers until all acid catalyst is neutralized, i.e. a pH between 6.5 and 7.5 is reached; or 1(b) soaking the rollers in water and then passing the rollers through rubber rolls or the like to compress the rollers and thus extract any solution therefrom;

2) soaking the rollers in mineral acid at a concentration of 1 to 20% by weight (preferably between 1 and 5%) and washing and rinsing until all of the acid catalyst has been removed;

3) oxidizing unreacted aldehydes that are within the pore structure to form carboxylic acids and neutralizing the acids to soluble salts and washing and rinsing to remove the salts, while raising the pH beyond 7.0 to precipitates metals;

4) washing and rinsing to remove loosely held particulate matter;

5) washing with deionized water, extracting and rinsing, the last rinse being with distilled water.

The steps above reduce extractable residue and particulate matter to very low levels (see the test results below) that are suitable for cleaning magnetic disk surfaces or the like. However, for cleaning silicon wafers, it is desirable that extractable residues of elements such as, calcium, zinc, arsenic, barium, cadmium, chloride, chromium, copper, iron, lead, manganese, magnesium, mercury, nitrate, potassium, selenium, silica, silver, and sodium each be reduced to 2 ppm. or less, preferably 1 ppm. or less. Also, it is desirable to reduce extractable sulfate to a value 10 ppm. or less. Reducing the values of extractable calcium and zinc is particularly important. Applicant has developed an additional second extraction process, to be conducted in seriatim with the first extraction process, that reduces extractable residue to these values. The second extraction process includes the following steps:

1) high turbulence washing and rinsing and then centrifugal extraction to remove all liquid;

2) exposure, through submersion or the like, to an acid solution of 0.1 to 10% by weight (preferably 0.2 to 2.0%) of a mineral acid such as sulfuric acid for 1 to 90 hours (preferably 4 to 48 hours).

3) more high turbulence washing and rinsing;

4) oxidation of reactant aldehydes by soaking the rollers in an oxidizing bath up to 10% concentration within adjustment for pH between 7.5 and 11 (preferably between 8.0 and 9.5 in a hydrogen peroxide bath at 0.05% to 2.0% concentration) for to 96 hours (preferably 4 to 36 hours).

5) repeat of steps 1–4 above until the pantanedione test, or a similar test, for aldhehyde indicates less than 1.0 ppm HCO equivalent; and 6) sterilization by electron beam radiation to destroy microorganisms, such as mold spores, which can contaminate the final product.

Steps 1–5 above reduce residue to a very low value. Step 6 eliminates the need for pesticide or other additives for sterilizing the roller. These additives require an expensive washout procedure and can further contribute to residue.

Figure 6:
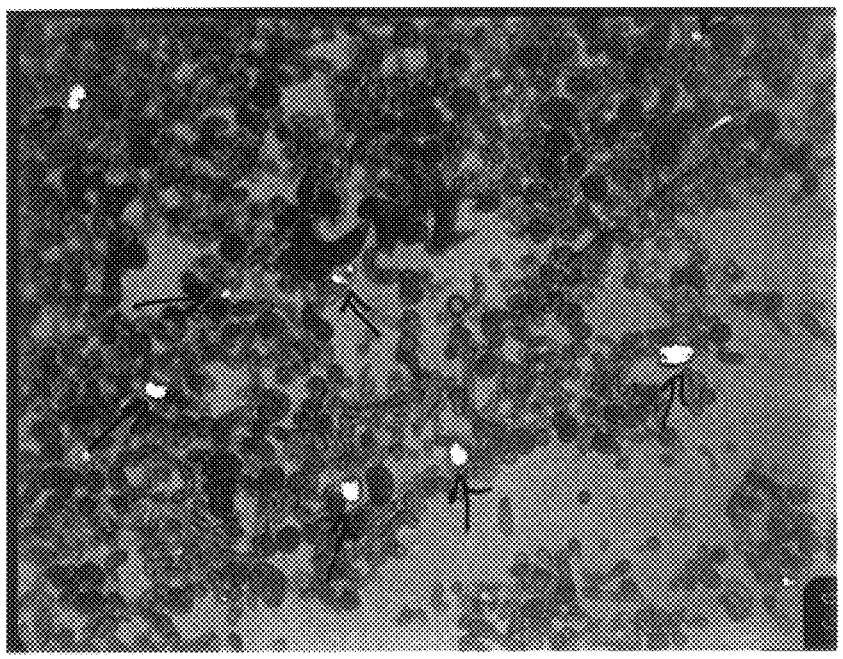
FIG. 6 is a microphotograph of the prior art sponge illustrating residual starch particles.
Figure 7:
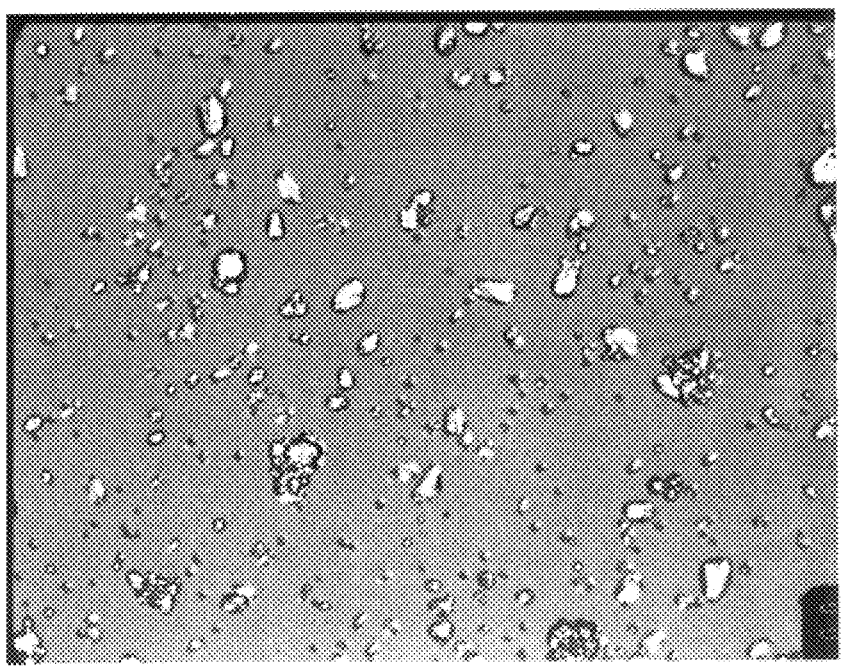
FIG. 7 is a microphotograph of the prior art sponge at 100x magnification illustrating the bi-refringent calorimetric method used to isolate the starch particles.

FIGS. 6 and 7 respectively illustrate residue (potato starch) remaining in the sponge material of the conventional sponge before use. The whitish spots in FIG. 6 are residue. FIG. 7 illustrates the bi-refringent calorimetric method used to isolate and detect the starch particles. Because the invention does not use starch to form pores, this residue is eliminated in the invention.

Comparative testing between the sponge material subjected to the extraction processes of the invention and the conventional sponge not subjected to the inventive extraction processes has been conducted. The first series of tests was a measure of extractible residue contained in the sponge material. The results of this test are illustrated in Tables 1–4 below.

TABLE 1

(Invention Subjected to First Extraction Process Only):

| COMPONENT | INVENTION | COMPETITIVE SPONGE |
|---|---|---|
| Calcium | 2.6 ppm | 2.6 ppm |
| Chloride | not detected | 10 ppm |
| Magnesium | .17 ppm | .22 ppm |
| Potassium | .21 ppm | 6.3 ppm |
| Nitrate | 1.1 ppm | 1.3 ppm |
| Nitrite | not detected | not detected |
| Silicon | not detected | not detected |
| Sodium | 3.4 ppm | 5.8 ppm |
| Total Non Volatile Residues | 36 ppm | 39 ppm |

TABLE 2

(Invention Subjected to First and Second Extraction Process):

| COMPONENT | INVENTION | COMPETITIVE SPONGE |
|---|---|---|
| Calcium | 0.55 ppm | 2.1 ppm |
| Chloride | Not Detectable | 33.0 ppm |
| Fluoride | 0.98 ppm | 125 ppm |
| Magnesium | 0.27 ppm | 3.8 ppm |
| Potassium | 0.16 ppm | 16.0 ppm |
| Sodium | 1.1 ppm | 223 ppm |
| Sulfate | 5.4 ppm | 79 ppm |
| Zinc | 0.07 ppm | 4.5 ppm |
| Total Non Volatile Residue | Not Detectable | 308 ppm |

TABLE 3

(Invention Subjected to First and Second Extraction Processes):

| COMPONENT | INVENTION | COMPETITIVE SPONGE |
|---|---|---|
| Calcium | 0.2 ppm | 2.60 ppm |
| Potassium | 0.03 ppm | 6.30 ppm |
| Nitrate | 0.3 ppm | 1.30 ppm |

TABLE 3-continued (Invention Subjected to First and Second Extraction Processes):

| COMPONENT | INVENTION | COMPETITIVE SPONGE |
|---|---|---|
| Total Non Volatile Residues | Not Detectable | 39.0 ppm |

TABLE 4

(Invention Subjected to First and Second Extraction Processes):

| COMPONENT | INVENTION | COMPETITIVE SPONGE |
|---|---|---|
| Arsenic | Not Detectable | Not Detectable |
| Barium | Not Detectable | Not Detectable |
| Cadmium | Not Detectable | Not Detectable |
| Calcium | 0.2 ppm | 1.6 ppm |
| Chloride | Not Detectable | 57 ppm |
| Chromium | Not Detectable | Not Detectable |
| Copper | Not Detectable | 1.1 ppm |
| Iron | Not Detectable | 1.6 ppm |
| Lead | Not Detectable | Not Detectable |
| Manganese | Not Detectable | 0.09 ppm |
| Magnesium | Not Detectable | 7.4 ppm |
| Mercury | Not Detectable | Not Detectable |
| Nitrate | 0.3 ppm | 3.95 ppm |
| Potassium | 0.03 ppm | 26 ppm |
| Selenium | Not Detectable | Not Detectable |
| Silica | Not Detectable | Not Detectable |
| Silver | Not Detectable | Not Detectable |
| Sodium | 0.94 ppm | 442 ppm |
| Sulfate | 2.6 ppm | 79 ppm |
| Total Non Volatile Residue | Not Detectable | 575 ppm |
| Zinc | 0.04 | 4.5 |

From the test results above, it is clear that the invention has far less extractable residue than the competitive product. Additionally particulate analysis testing was conducted on a sponge of the preferred embodiment and a conventional sponge. Both the IES-RP-004 biaxial shake test and the IES-RP-004 new zero mechanical stress test were used. These test results are presented in Table 5 and Table 6 below.

TABLE 5

(Biaxial Shake Test):

| | Competitive Sponge | Invention Using First Extraction Process Only | Invention Using First and Second Extraction Processes |
|---|---|---|---|
| Number of Particles Released per $cm^2$ | 338,725 | 25,301 | 7026 |

TABLE 6

(New Zero Mechanical Stress Test):

| | Competitive Sponge | Invention Using First Extraction Process Only | Invention Using First and Second Extraction Processes |
|---|---|---|---|
| Number of Particles Released per $cm^2$ | 37,140 | 1,462 | 982 |

The test results above show that the particulate matter released by the invention is substantially lower than that of the competitive device. Therefore, the invention is less likely to damage or contaminate the surface that is to be cleaned. The actual amount of residue after extraction varies somewhat depending on the residue before extraction which is a function of the completeness of reactions during formation of the sponge.

The extraction processes disclosed above yield a sponge with low extractable residue. By performing both the first and second extraction processes and culling out sponges having residues greater than a desired value for desired elements, a sponge can be made that is particularly suitable for cleaning semiconductor wafers or other materials that must be cleaned very effectively. For example, sponges having 1 ppm or less of zinc and calcium can be selected for cleaning semiconductor wafers. Prior art extraction does not yield a sponge material having such low extractable residues for any starting sponge material. Therefore, the invention provides a sponge that is superior in cleaning semiconductor wafers or the like. Prior art extraction did not attain the low values of extractable residue, particularly zinc and calcium, that are made possible by the invention.

The disclosed extraction processes can be used to purify other sponge materials, such as that of the competitive product. However, the results may not be as good because the prior art has closed pores and fibrils as noted above. Also, the extraction processes can be applied to sponges rollers that do not have projections or that have different shaped projections. Further, the extraction process and disclosed sponge material can be applied to pads or other cleaning apparatus that are not rollers.

The invention has been described through a preferred embodiment. However, it will be apparent the various modifications can be made without departing from the scope of the invention as defined by the appended claims.

What is claimed:

1. A method for extracting residue from an industrial sponge material comprising, in order, the steps of:
   a) washing and rinsing the material a first time;
   b) removing all liquid from the material;
   c) exposing the material to a first acid solution;
   d) washing and rinsing the material a second time;
   e) exposing the material to a first oxidizing solution; and
   f) washing and rinsing the material a third time thereby extracting the residue from the industrial sponge material.

2. The method as recited in claim 1, further comprising, after said step (f) the steps of:
   g) washing the material with deionized water; and
   h) rinsing the material with distilled water.

3. A method as recited in claim 2, wherein said acid solution is mineral acid at a concentration of 1 to 20% by weight.

4. The method as recited in claim 2, wherein, during said step (e), the pH is raised above 7.0

5. The method as recited in claim 2, further comprising the steps of:
   i) washing and rinsing the material a fourth time;
   j) removing all liquid from the material;
   k) exposing the material to a second acid solution;
   l) washing and rinsing the material a fifth time;
   m) exposing the material to a second oxidizing solution; and
   n) repeating steps (i) through (n) until the material contains less than 1.0 ppm HCO equivalent.

6. The method as recited in claim 5, further comprising the step of:
   sterilizing the material by irradiating the material with electron beam radiation.

7. The method as recited in claim 5, wherein said second acid solution in step (k) is 0.1 to 10% by weight of a mineral acid.

8. The method as recited in claim 5, wherein said second acid solution in step (k) is 0.2 to 2.0% by weight of a mineral acid.

9. The method as recited in claim 5, wherein said second oxidizing solution in step (m) has a pH of 7.5–11.

10. The method as recited in claim 5, wherein said second oxidizing solution in step (m) has a pH of 8.0–9.5.

11. The method as recited in claim 5 wherein steps (a)–(n) result in a residual amount of zinc in the industrial sponge material being 2 ppm or less.

12. The method as recited in claim 5 wherein steps (a)–(n) result in a residual amount of calcium in the industrial sponge material being 2 ppm or less.

13. The method as recited in claim 5 wherein steps a–n result in a residual amount of zinc in the industrial sponge material being 1 ppm or less.

14. The method as recited in claim 5 wherein steps a–n result in a residual amount of calcium in the industrial sponge material being 1 ppm or less.

15. The method as recited in claim 5, wherein said steps a–n result in a residual amount of each of arsenic, barium, cadmium, chloride, chromium, copper, iron, lead, manganese, magnesium, mercury, nitrate, potassium, selenium, silica, silver, and sodium having a concentration of 1 ppm or less.

* * * * *